United States Patent [19]
Ahmed

[11] 4,028,631
[45] June 7, 1977

[54] CURRENT AMPLIFIERS

[75] Inventor: Adel Abdel Aziz Ahmed, Annandale, N.J.

[73] Assignee: RCA Corporation, New York, N.Y.

[22] Filed: Apr. 26, 1976

[21] Appl. No.: 680,074

[52] U.S. Cl. .................................. 330/19; 330/22; 330/24; 330/25; 330/28

[51] Int. Cl.² .......................................... H03F 3/343

[58] Field of Search ................ 330/19, 20, 22, 24, 330/25, 28, 38 M, 40

[56] References Cited
UNITED STATES PATENTS 3,868,581   2/1975   Ahmed ............................. 330/22 X Primary Examiner—James B. Mullins
Attorney, Agent, or Firm—H. Christoffersen; S. Cohen; A. L. R. Limberg

[57] ABSTRACT

Reduction of the input impedance of a current amplifier comprising a first common-emitter amplifier transistor followed in direct-coupled cascade connection by a second common-emitter amplifier transistor is furthered by providing the first transistor with a direct-coupled collector-to-base feedback connection of the following type. A source of bias current has connections to the base and to the collector electrodes of said first transistor through respective impedance elements, as may respectively consist of equal numbers of forward-biased semiconductor junctions.

5 Claims, 10 Drawing Figures

CURRENT AMPLIFIERS

The present invention relates to the reduction of the input impedance of current amplifiers of the type comprising a first common-emitter amplifier transistor followed in direct-coupled cascade by a second common-emitter amplifier transistor, in which the impedance of the input circuit is reciprocally related to the magnitude of current flow through it.

In the present invention, reduction of the input impedance of a current amplifier of this type is furthered by providing the first transistor with direct-coupled collector-to-base feedback of a type wherein a source of bias current has connections to the base and to the collector electrodes of the first transistor through respective impedance elements, as may respectively consist of equal numbers of forward-biased semiconductor junctions. This type of feedback connection permits the reduction of input impedance without introducing a large direct component into the output current of the current amplifier. This, because the direct component of collector current response of the first transistor to that portion of the bias current flowing to the input circuit of the current amplifier to reduce its impedance is counteracted to substantial extent before being applied to the base electrode of the second transistor, being counteracted by that portion of the bias current flowing to the collector current of the first transistor.

Figure 2:
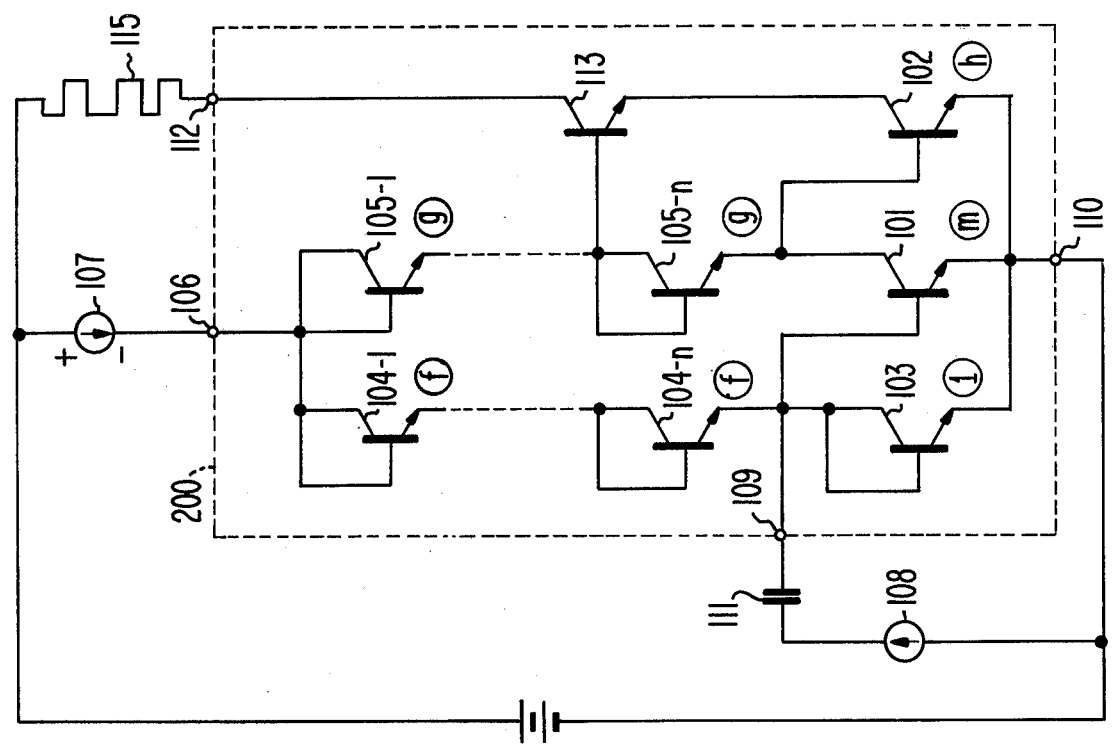
Figure 3:
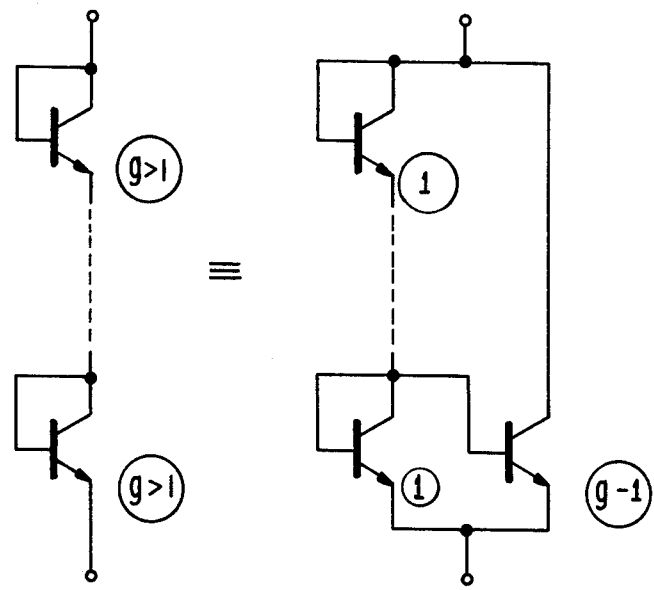

Each of FIGS. 1, 2 and 4–10 is a schematic diagram of a current amplifier embodying the present invention; and FIG. 3 shows equivalent circuitry used for modifying the FIG. 2 current amplifier structurally to form another current amplifier embodying the present invention.

Figure 1:
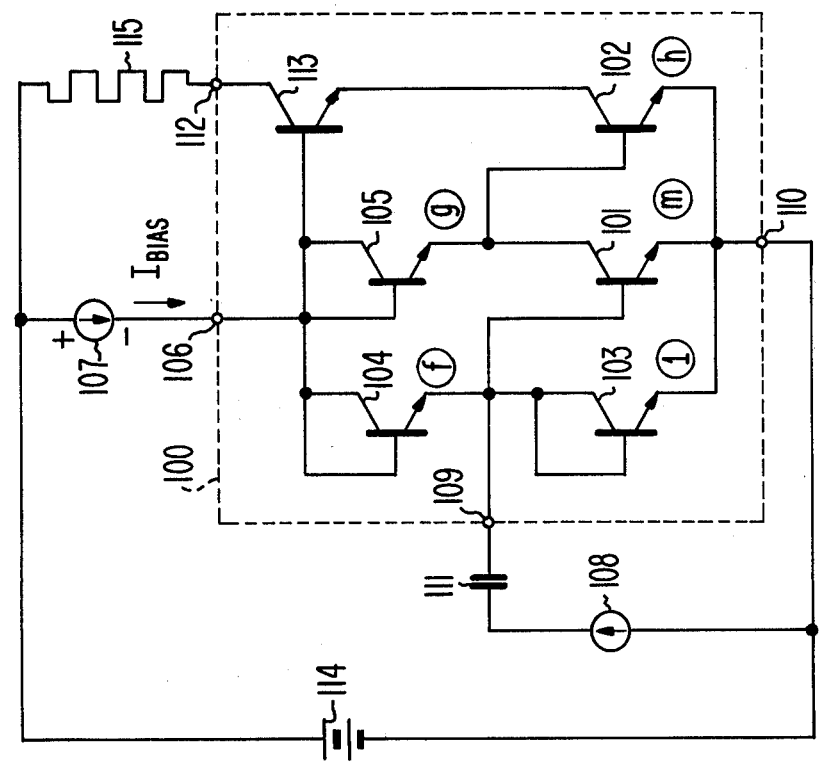

In FIG. 1, current amplifier 100 comprises the direct-coupled cascade connection of common-emitter amplifier transistors 101 and 102. Diode 103, a self-biased transistor, parallels the base-emitter junction of transistor 101 to form a current mirror amplifier. This current mirror amplifier has a direct-coupled feedback connection from its output circuit to its input circuit via diodes 105 and 104. Diodes 104 and 105, each a self-biased transistor, are forward biased by separate portions of a current $I_{BIAS}$ applied between terminals 106 and 110 from a constant current generator 107.

The input signal current from generator 108 is applied between the input terminal 109 and common terminal 110 of the configuration either through a coupling capacitor 111, as shown, or by suitable direct coupling. Input terminal 109 is connected to the base electrode of transistor 101, and transistors 101 and 102 have their emitter electrodes directly connected to the common terminal 110. The collector electrode of transistor 102 is galvanically connected to an output terminal 112, which connection is preferably via a common-base amplifier transistor 113 connected in cascode relationship with transistor 102 and arranged to regulate the collector potential of transistor 102 substantially to equal the collector potential of transistor 101. This eliminates variation of emitter-to-collector potential affecting the transconductance of transistor 102 relative to the transconductances of transistors 101, 103, 104 and 105.

Terminal 112 is connected to utilization means that bias is sufficiently positive (at least +1 volt when transistor 113 is included) to maintain normal transistor action of the transistors in current amplifier 100. This may be done as shown by serially connecting a supply 114 of operating potential and a load 115 with a direct current conductive path therethrough between terminals 110 and 112. Alternatively, a parallel combination of a load and a constant current generator may be connected between terminals 110 and 112.

Encircled numerals or algebraic symbols near the emitter electrodes of certain of the transistors indicate the effective areas of their base-emitter junctions respective to each other. Each of the transistors obeys the following well-known relationship.

$$V_{BE} = (kT/q)\ln(I_E/AJ_S) \qquad (1)$$

where $V_{BE}$ is the transistor base-emitter potential,
$k$ is Boltzmann's constant,
$q$ is the charge on an electron,
$T$ is the operating temperature of the transistor base-emitter junction,
$I_E$ is the transistor emitter current,
$A$ is the effective area of the transistor base-emitter junction, and
$J_S$ is the value of $I_E/A$ for $V_{BE} = 0$.

The quantities of $k$ and $q$ are universal constants. The base-emitter junctions of all the transistors are assumed to have similar diffusion or implantation profiles, so they have equal $J_S$'s. The transistors are assumed to be thermally coupled to each other or to some common heat conductor so they have equal $T$'s. $V_{BE}$, $I_E$ and $A$, as well as $I_B$ and $I_C$, transistor base current and transistor collector currents respectively, will bear as subscripts the identification numerals of the particular transistors with which they are associated.

To facilitate analysis, assume the common-emitter forward current gains ($h_{fe}$'s) of all the transistors 101, 102, 103, 104, 105 and 113 to be large enough that their respective $I_B$'s are relatively negligible to their respective $I_C$'s and $I_E$'s. Assume $I_B$'s of transistors 101, 102 and 113 to be negligibly small compared to the $I_E$'s of transistors 103, 104 and 105. These assumptions introduce little error in circuits wherein the transistors have $h_{fe}$'s of 30 or more, and one skilled in the art can allow for the effects of transistors with lower $h_{fe}$'s.

Transistors 101 and 103 have the same base-emitter potentials because of their connection as a current mirror amplifier.

$$V_{BE101} = V_{BE103} \qquad (2)$$

Substituting the following special cases (3) and (4) of equation 1 into equation 2 results in equation 5.

$$V_{BE101} = (kT/q)\ln(I_{E101}/mJ_S) \qquad (3)$$

$$V_{BE103} = (kT/q)\ln(I_{E103}/J_S) \qquad (4)$$

$$I_{E101} = mI_{E103} \qquad (5)$$

A normalized value of $I_{BIAS}$ is assumed, as follows $$I_{BIAS} = m + 1 \qquad (6)$$

The collector-to-base feedback connection of transistor 101 through diodes 105 and 104 adjusts the apportionment of $I_{BIAS}$ between (a) the path through diodes 104 and 103 and (b) the path through diode 105 and from collector-to-emitter of transistor 101, so as to fulfill equation 5 under quiescent conditions.

Accordingly, a quiescent current of normalized value unity will flow as $I_{E103}$ and $I_{E104}$ through serially-connected diodes 103 and 104, respectively, and a quiescent current of normalized value $m$ will flow as $I_{E105}$ and $I_{C101} = I_{E101}$ through the collector-to-emitter path of transistor 101.

Suppose now an input signal from source 108 causes a perturbation $+\Delta$ in the unity current flow through diode 103 —i.e., $$I_{E103} = (1 + \Delta) \tag{7}$$

Substituting equation 7 into equation 5 yields equation 8.

$$I_{E101} = m(1 + \Delta) \tag{8}$$

$I_{E105}$ is substantially equal to $I_{C101}$, in turn substantially equal to $I_{E101}$, so equation 9 can be written.

$$I_{E105} = m(1 + \Delta) \tag{9}$$

Equation 10 is obtained by applying Kirchoff's Law of Currents to the node at terminal 106.

$$I_{E104} = I_{BIAS} - I_{E105} \tag{10}$$

Substituting from equations 6 and 9 into 10 yields equation 11.

$$I_{E104} = (m+1) - m(1+\Delta) = (1 - m\Delta) \tag{11}$$

The input signal current $i_{in}$ required to obtain the perturbation $\Delta$ can now be determined by applying Kirchoff's Law of Currents to the node at input terminal 109.

$$i_{in} = I_{E103} - I_{E104} = (1+\Delta) - (1-m\Delta) = (m+1)\Delta \tag{12}$$

So the perturbation in current flow through diode 103 is $(m+1)$ times smaller than it would be were there no collector-to-base feedback connection of transistor 101. That is, the collector-to-base feedback connection reduces the input impedance of the current amplifier $(m+1)$ times over a simple current mirror amplifier with transistors biased to the same quiescent current levels as transistors 103 and 101.

Attention will now be shifted from consideration of what the input impedance is between terminals 109 and 110 to consideration of what the nature of the output current applied from output terminal 112 is. This output current is, except for the small attenuation caused by the common-base amplifier action of transistor 113, equal to $I_{C102}$. $I_{C102}$, substantially equal to $I_{E102}$, flows responsive to $V_{BE102}$, as expressed in equation 1. $V_{BE102}$ can be determined in accordance with Kirchoff's Law of Voltages to be as follows.

$$V_{BE102} = V_{BE103} + V_{BE104} - V_{BE105} \tag{13}$$

Substituting equation 1 into equation 13 produces equation 14, which can be simplified to equation 15.

$$(kT/q)\ln(I_{E102}/hJ_S) = (kT/q)\ln(I_{E103}/J_S) + (kT/q)\ln(I_{E104}/fJ_S) - (kT/q)\ln(I_{E105}/gJ_S) \tag{14}$$

$$I_{E102} = (gh/f)(I_{E103} I_{E104}/I_{E105}) \tag{15}$$

Substituting normalized values of $I_{E103}$, $I_{E104}$ and $I_{E105}$ into equation 15 produces equation 16.

$$I_{E102} = (gh/f)[(1+\Delta)(1-m\Delta)/m(1+\Delta)] = (gh/f)[1/m) - \Delta] = (gh/fm) - (gh/f)\Delta \tag{16}$$

$I_{E102}$ consists of a quiescent component $gh/f_m$ obtained in response to the normalized value of $I_{BIAS}$, $(m+1)$, and an output signal component $I_{OUT} = (gh/f)\Delta$ obtained in response to $I_{IN} = (m+1)\Delta$. The current gain between input and output terminals is calculated as follows.

$$I_{OUT}/I_{IN} = (gh/f)\Delta/[(m+1)\Delta] = gh/f(m+1) \tag{17}$$

To obtain high current gain, $f$ is advantageously made as small as possible; and the product of $g$ and $h$, as large as possible. In pursuit of the latter, die area is conserved if $g$ and $h$ are made as nearly equal as possible.

The current gain of amplifier 100 is well-defined as a ratio of the effective areas of the base-emitter junctions of certain of its component transistors and is substantially temperature-independent. So in many applications it can replace a simple current mirror amplifier comprising a transistor having its base-emitter junction paralleled by a diode—i.e., a self-biased auxiliary transistor—and having a current gain of $gh/f(m+1)$. The input impedance of such a simple current mirror amplifier without overall current feedback, is substantially equal to the reciprocal of the transconductance of the auxiliary transistor; and it is well-known the transconductance of a junction transistor is proportional to its emitter current. As pointed out above, the input impedance of current amplifier 100 is $(m+1)$ times lower than that of the simple current mirror amplifier comprising transistor 101 and diode 103 bereft of overall current feedback and operated at the same current levels. To achieve as low an input impedance in the simple current mirror amplifier without overall current feedback as in current amplifier 100, normalized quiescent input current must be increased from unity to $(m+1)$.

The simple current mirror amplifier without overall current feedback has the same current gain $gh/f(m+1)$ for quiescent input current as for signal input current. So it will respond to an $(m+1)$ normalized quiescent input current with a normalized quiescent output current $gh/f$— that is, the $(m+1)$ input current times its current gain $gh/f(m+1)$. The quiescent component of output current of a simple current amplifier without overall current feedback is thus $m$ times as large as that of a current amplifier 100 configuration of similar input impedance and current gain. it is usually desirable to reduce the amplitude of the quiescent component of output current vis-a-vis the amplitude of its signal component, however, to facilitate direct coupling to following circuitry or to operate over a wider range of operating supply when working into a resistive load. So current amplifier 100 enjoys a significant operating advantage over a current mirror amplifier.

In current amplifier 200 of FIG. 2, diode 104 is replaced by a series string of $n$ diodes 104-1, . . . and 105-1, . . . 105-$n$, where $n$ is a positive integer. By analysis similar to that employed with regard to the FIG. 1 circuit, it can be shown that the input impedance of amplifier 200 is the same as that for amplifier 100, and the following expression for $I_{E102}$ in current amplifier 200 can be obtained.

$$I_{E102} = (gh/fm)^n[(1-m\Delta)^n/(1+\Delta)^{(n-1)}] \quad (18)$$

Approximate values of $I_{E102}$ can be arrived at proceeding from the binominal expansions of 19 and 20.

$$(1-m\Delta)^n = 1-nm\Delta \text{ \& higher order terms in } m\Delta \quad (19)$$

$$(1+\Delta)^{(n-1)} = 1 + 1 + (n-1)\Delta \text{ \& higher order terms in } \Delta \quad (20)$$

If $m$ and $\Delta$ are sufficiently small compared to unity, the higher order terms in $m\Delta$ and $\Delta$ can be ignored, and equation 18 reduces to approximation 21 below.

$$I_{E102} \cong h(g/fm)^n\{(1-nm\Delta)/[1+(n-1)\Delta]\} \quad (21)$$

Input signal currents applied to terminal 109 are amplified with some distortion, but with a gain $mn$ times as large as that for $I_{BIAS}$ applied to terminal 106.

FIG. 3 shows a known substantial equivalent circuit for replacing the $n$ serially connected self-biased transistors with base-emitter junction areas of $g$ in the FIG. 2 circuit.

Figure 4:
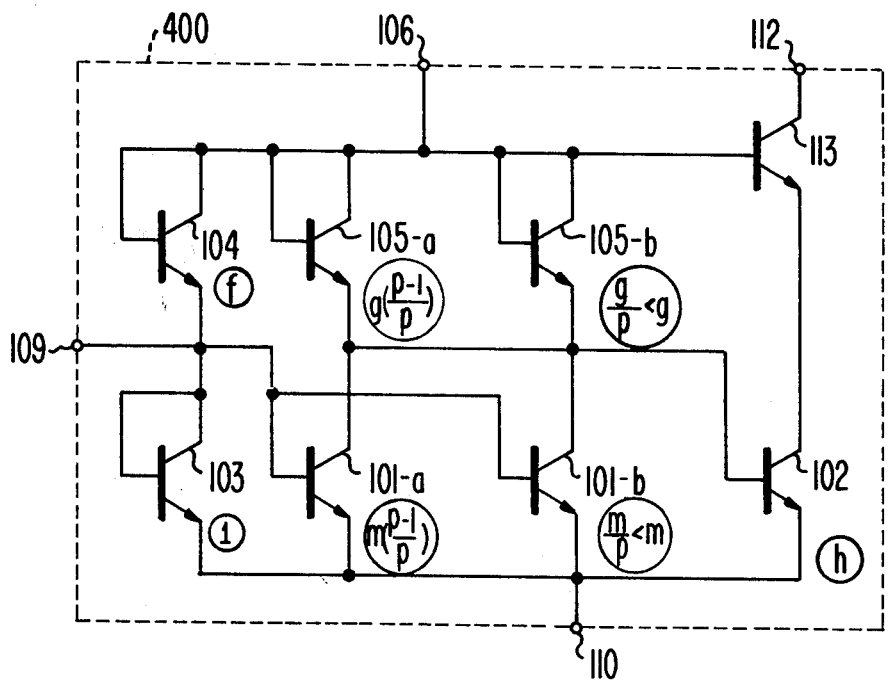

FIG. 4 shows a current amplifier 400 which is the electrical equivalent of current amplifier 100. In this equivalent circuit, transistor 101 is replaced by two parallel transistors 101-a and 101-b having the same overall transconductance characteristics as transistor 101, and transistor 105 is replaced by two parallel transistors 105-a and 105-b having the same overall transconductance characteristics as transistor 105. Transistors 101-a, 101-b, 105-a and 105-b are in a balanced bridge arrangement with substantially no current flowing in the connection between the emitter electrodes of transistors 105-a and 105-b. Self-biased transistor 105-b may then be replaced by direct connection without significant effect upon circuit operation.

Figure 5:
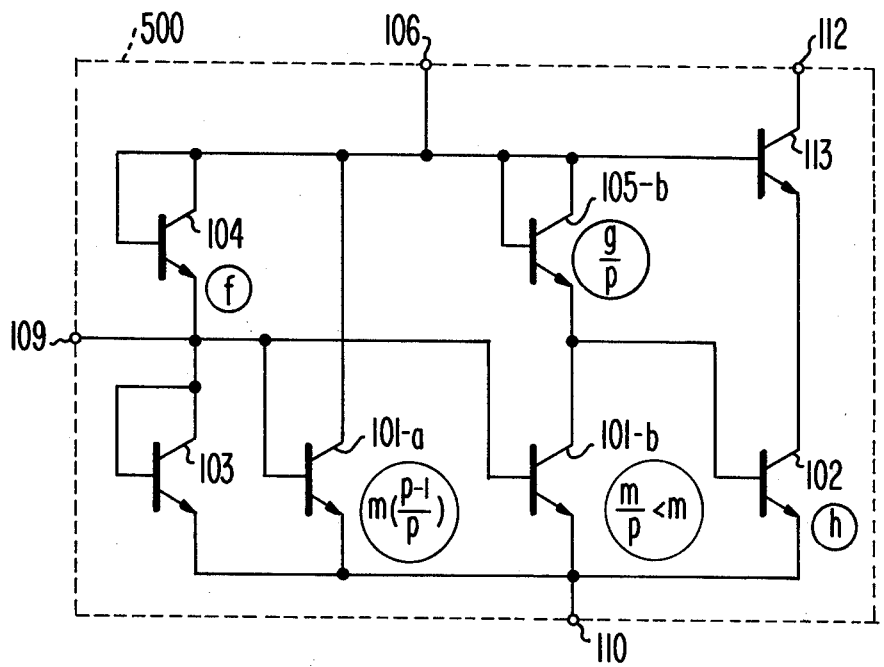

FIG. 5 shows the resulting configuration 500, which takes up less area on an integrated circuit die than the FIG. 1 configuration. The base-emitter junction area of transistor 105-b is smaller than that of transistor 105 by a factor $p$, while transistors 101-a and 101-b can be integrated in almost as small area as transistor 101.

Figure 6:
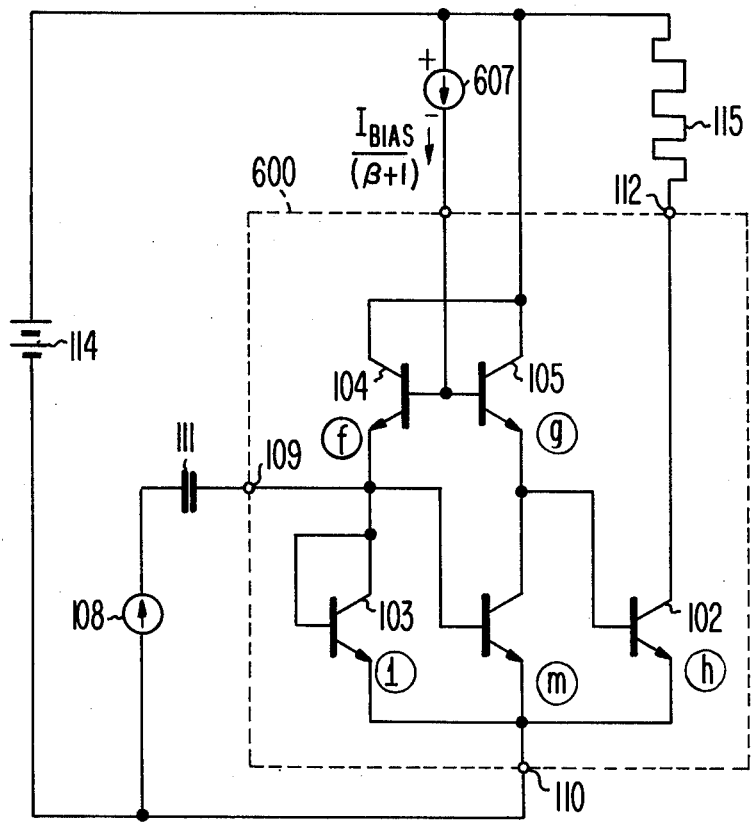

FIG. 6 shows another alternative 600 to current amplifier 100, in which alternative transistors 104 and 105 are not self-biased and the interconnection of their base electrodes are biased from a constant current generator 607 providing a current inversely proportional to $(\beta + 1)$ where $\beta$ is the common emitter forward current gain of transistors 104 and 105. Generator 607 may comprise a transistor similar to transistor 101 with emitter current regulated to $I_{BIAS}$ and with its resultant $I_{BIAS}/(\beta + 1)$ base current changed in direction by a current mirror amplifier for application to the bias terminal 106.

Figure 7:
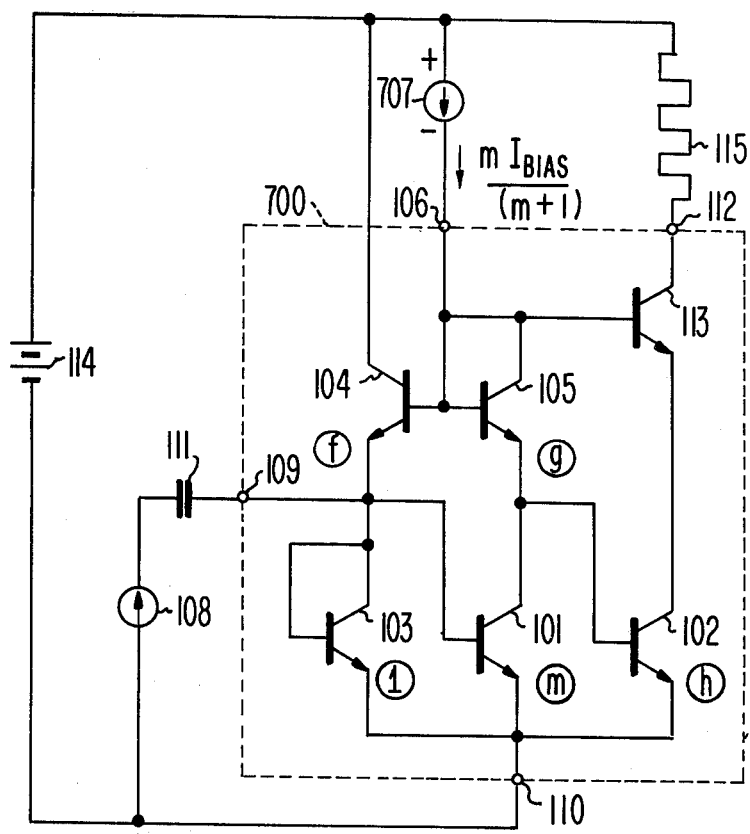

FIG. 7 shows another alternative 700 to current amplifier 100 in which transistor 105 is self-biased while transistor 104 is not. Current source 107 is replaced by current source 707 supplying a bias current essentially $m/(m+1)$ as large as $I_{BIAS}$.

Figure 8:
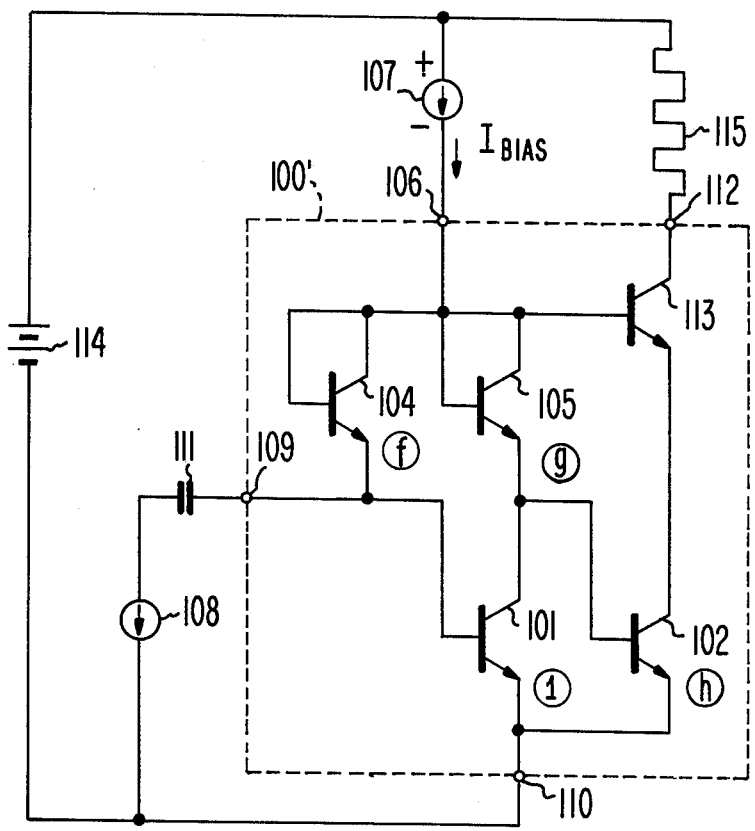
Figure 9:
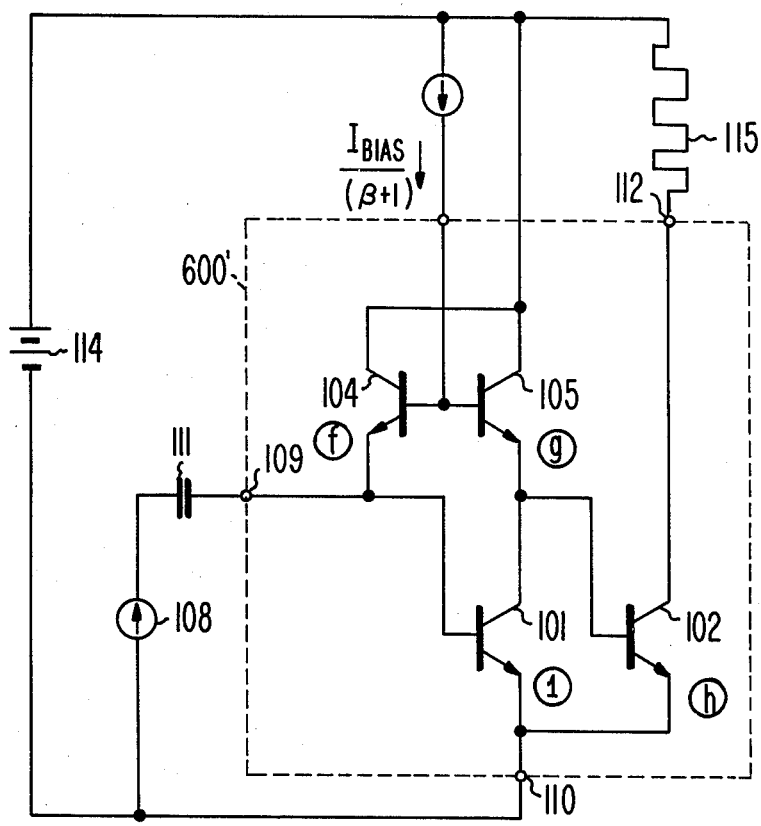
Figure 10:
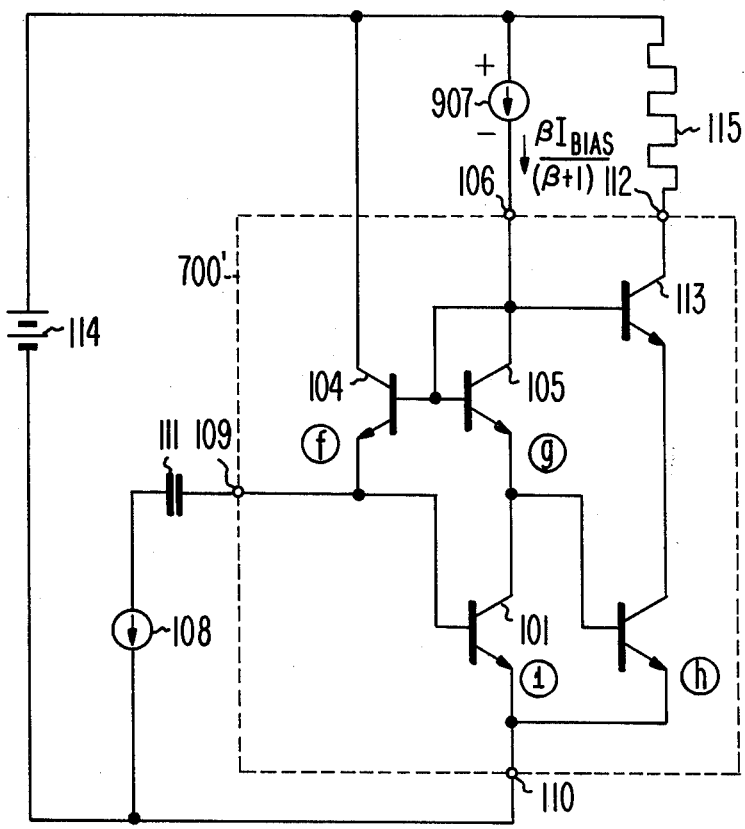

FIGS. 8, 9 and 10 show variants 100', 600' and 700' of current amplifiers 100, 600 and 700, respectively, in which the current mirror amplifier including transistors 101 and 103 and having a current gain $m$ is replaced by transistor 101 alone, having a common-emitter forward current gain of $\beta$. $\beta$ replaces $m$ in the equations describing circuit operation. Embodiments of the present invention wherein current amplifier 200 is modified similarly to current amplifier 100 in FIGS. 4–10 are also possible.

In Claims 1 and 2 following, the word "diode" includes within its scope each of the following: a simple $pn$ junction, the base-emitter junction of a transistor, and a self-biased transistor.

What is claimed is:

1. A current amplifier comprising:
    an input terminal;
    an output terminal;
    a common terminal;
    a bias terminal;
    first and second transistors of similar conductivity type operated at substantially the same absolute temperature T, each having base and emitter electrodes with a base-emitter junction therebetween and having a collector electrode, their emitter electrodes being directly connected to said common terminal, said input terminal being at the base electrode of said first transistor, the collector electrode of said first transistor being direct coupled to the base electrode of said second transistor, the collector electrode of said second transistor being galvanically connected to said output terminal;
    an even-numbered plurality of diodes each operated at an absolute temperature substantially equal to T, a first half of the diodes being connected in a path between said bias and input terminals and poled for forward conduction of the quiescent base currents of said first transistor, and a second half of the diodes consisting of the remaining diodes being connected in a path between said bias terminal and the collector electrode of said first transistor and poled for forward conduction of the quiescent collector current of said first transistor;
    means for applying a direct bias current between said bias and common terminals in a poling providing for the flow of said quiescent base and collector currents of said first transistor; and
    means, exclusive of the foreclaimed elements for applying an input signal current between said input and common terminals.

2. A current amplifier as set forth in claim 1 having a further diode connected in parallel with the base-emitter junction of said first transistor.

3. A current amplifier comprising:
    input, output and common terminals;
    an even-numbered plurality of semiconductor junctions;
    means exclusive of said semiconductor junctions for applying an input signal current between said input and common terminals;
    means for forward-biasing each of said semiconductor junctions;
    first and second junction transistors of the same conductivity type, each having base and emitter and collector electrodes and being operated at substantially the same temperature;
    means for connecting said first transistor as a first common-emitter amplifier, including a connection without intervening elements of its base electrode to said input terminal and a connection of its emitter electrode to said common terminal;
    means for connecting said second transistor as a second common-emitter amplifier in direct-coupled cascade after said first common-emitter amplifier, including a connection of its base electrode to the collector electrode of said first transistor, a connection of its emitter electrode to said common terminal and a connection of its collector to said output terminal; and a direct coupled current feedback connection of the collector electrode of said first transistor to its base electrode through a series connection of said plurality of semiconductor junctions poled in a first direction within said series connection and the remaining half of said plurality of semiconductor junctions poled in a second direction opposite to said first direction within said series connection.

4. A current amplifier as set forth in claim 3 having a third junction transistor of said same conductivity type having base and collector electrodes connected to said input terminal and having an emitter electrode connected to said common terminal.

5. A current amplifier comprising:
an input terminal;
an output terminal;
a common terminal;
a bias terminal;
first and second and third transistors of similar conductivity type operated at substantially the same absolute temperature T, each having base and emitter electrodes with a base-emitter junction therebetween and having a collector electrode, their emitter electrodes being directly connected to said common terminal, the base electrode of said first transistor having said input terminal connected thereto, the collector electrode of said second transistor being galvanically connected to said output terminal, the base and collector electrodes of said third transistor being connected to said input terminal;

a direct-coupled first impedance means connected between said bias and said input terminals;

second impedance means connected between said bias terminal and an interconnection, which interconnection is between the collector electrode of said first transistor andd the base electrode of said second transistor;

constant current generator means generating a constant current applied between said bias and said common terminals; and means, exclusive of the foreclaimed elements, for applying an input signal current between said input and common terminals.

* * * * *